United States Patent
Son et al.

(10) Patent No.: US 10,868,229 B2
(45) Date of Patent: Dec. 15, 2020

(54) ELECTRODE SUBSTRATE FOR TRANSPARENT LIGHT-EMITTING DEVICE DISPLAY, AND MANUFACTURING METHOD THEREFOR

(71) Applicant: LG CHEM, LTD., Seoul (KR)

(72) Inventors: Yong Goo Son, Daejeon (KR); Kun Seok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/619,056

(22) PCT Filed: Sep. 14, 2018

(86) PCT No.: PCT/KR2018/010830
§ 371 (c)(1),
(2) Date: Dec. 3, 2019

(87) PCT Pub. No.: WO2019/059589
PCT Pub. Date: Mar. 28, 2019

(65) Prior Publication Data
US 2020/0091392 A1 Mar. 19, 2020

(30) Foreign Application Priority Data
Sep. 19, 2017 (KR) .................. 10-2017-0120348

(51) Int. Cl.
*H01L 33/62* (2010.01)
*H05K 3/06* (2006.01)
*H05K 3/28* (2006.01)

(52) U.S. Cl.
CPC ............. *H01L 33/62* (2013.01); *H05K 3/067* (2013.01); *H05K 3/287* (2013.01); *H01L 2933/0066* (2013.01)

(58) Field of Classification Search
CPC . H01L 33/62; H01L 2933/0066; H05K 3/067; H05K 3/287
USPC ........................................................ 174/257
See application file for complete search history.

(56) References Cited

U.S. PATENT DOCUMENTS

| 5,589,306 | A | * | 12/1996 | Takahashi ............... G03F 7/027 430/18 |
| 6,567,148 | B1 | | 5/2003 | Akiyama et al. |
| 2003/0122468 | A1 | | 7/2003 | Cho et al. |
| 2010/0055605 | A1 | | 3/2010 | Seo et al. |
| 2010/0247940 | A1 | | 9/2010 | Takahashi et al. |

(Continued)

FOREIGN PATENT DOCUMENTS

| CN | 106660309 | 5/2017 |
| JP | H09-270573 | 10/1997 |

(Continued)

*Primary Examiner* — Tremesha S Willis
(74) *Attorney, Agent, or Firm* — Dentons US LLP

(57) ABSTRACT

A method of manufacturing an electrode substrate for a transparent light emitting device display that includes laminating copper foil on a transparent base material; forming a copper foil pattern by etching the copper foil; forming a transparent photosensitive resin composition layer on a front surface of the transparent base material and the copper foil pattern; and exposing at least a part of the copper foil pattern by removing at least a part of the transparent photosensitive resin composition layer provided on the copper foil pattern.

17 Claims, 7 Drawing Sheets

(56) References Cited

U.S. PATENT DOCUMENTS

| | | | |
|---|---|---|---|
| 2012/0318585 A1 | 12/2012 | Kim et al. | |
| 2014/0084272 A1 | 3/2014 | Fleissner et al. | |
| 2016/0378241 A1 | 12/2016 | Park et al. | |
| 2017/0095999 A1 | 4/2017 | Kaneiwa et al. | |
| 2017/0253719 A1* | 9/2017 | Morozumi | C08K 5/37 |
| 2017/0327714 A1* | 11/2017 | Seo | C09J 201/08 |
| 2017/0336710 A1* | 11/2017 | Baron | G03F 7/091 |
| 2019/0235148 A1* | 8/2019 | Hasegawa | G09F 9/30 |

FOREIGN PATENT DOCUMENTS

| | | |
|---|---|---|
| JP | H10-282513 | 10/1998 |
| JP | 2000148043 | 5/2000 |
| JP | 2009-200432 | 9/2009 |
| JP | 2011114194 | 6/2011 |
| JP | 2014-512075 | 5/2014 |
| JP | 2015157392 | 9/2015 |
| JP | 2017045855 | 3/2017 |
| KR | 20000055635 | 9/2000 |
| KR | 20120138287 | 12/2012 |
| KR | 20150095594 | 8/2015 |
| KR | 10-20160037514 | 4/2016 |
| KR | 20160126192 | 11/2016 |
| KR | 20170029838 | 3/2017 |
| TW | 200831547 | 8/2008 |
| TW | 201728463 | 8/2017 |

* cited by examiner

[Figure 1]
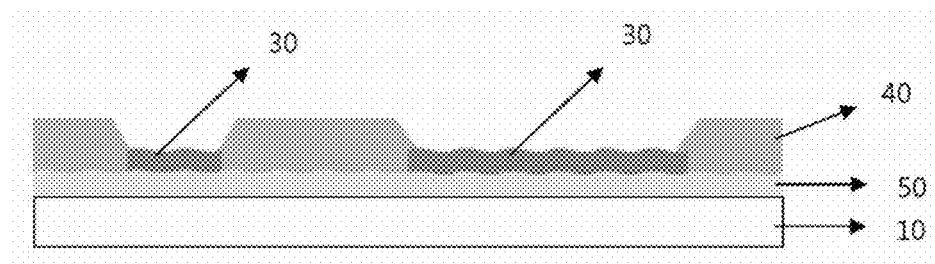
[Figure 2]
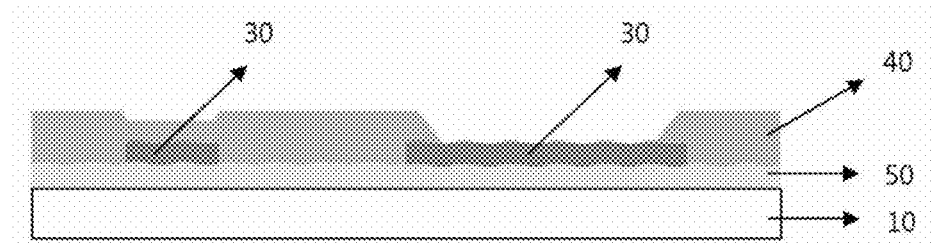

[Figure 4]
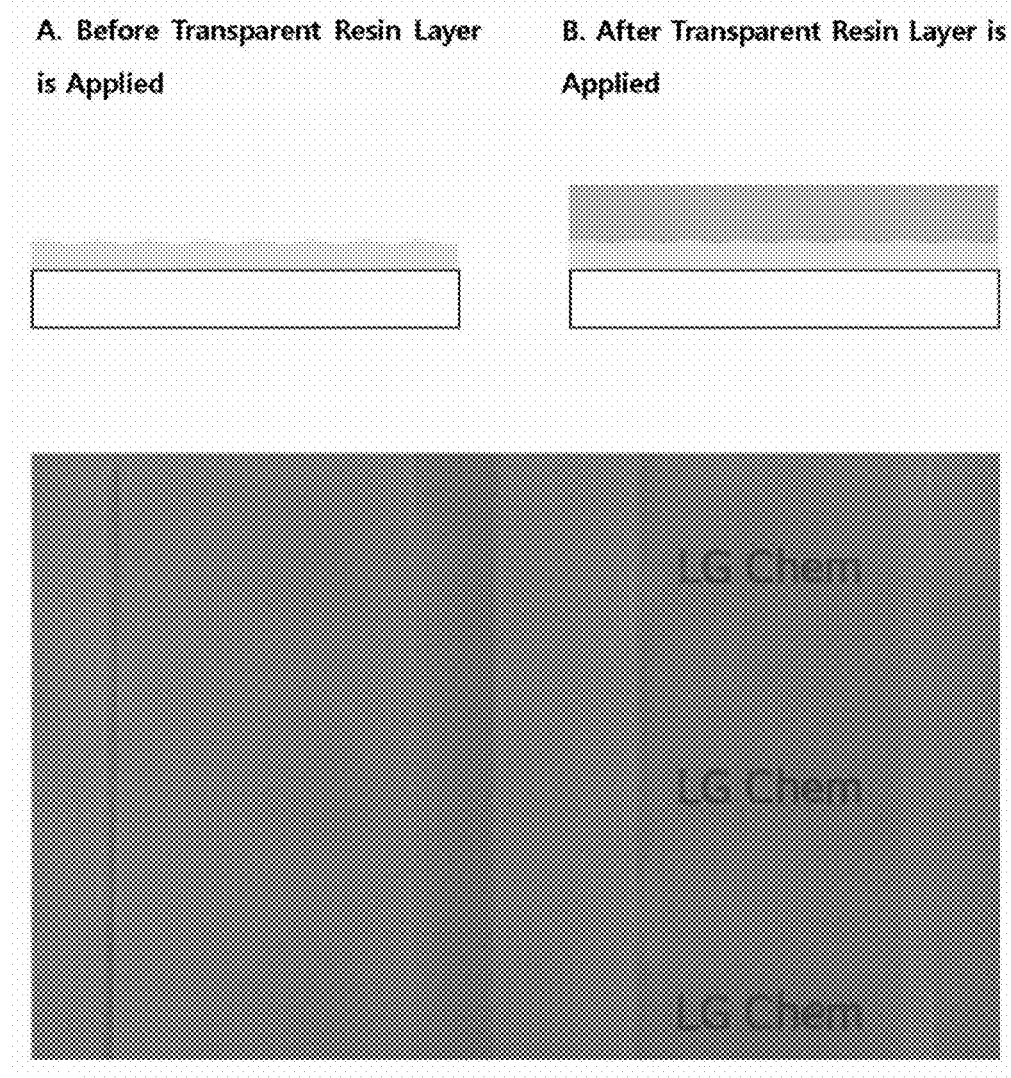
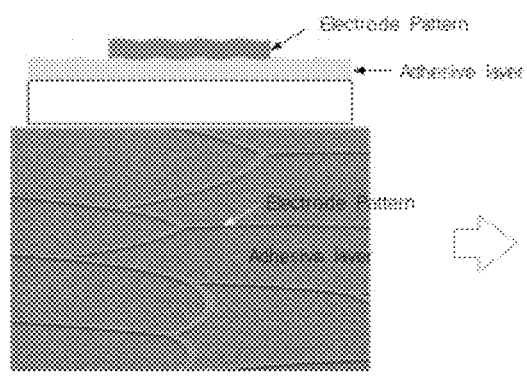
FIG. 5A
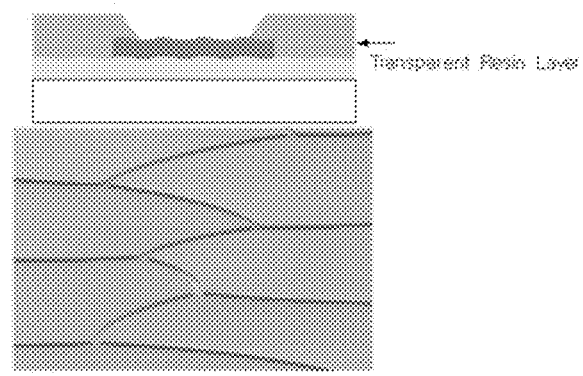
FIG. 5B

<Related Art, Short-Circuit Between Electrodes is Generated>

<Present Application, Short-Circuit Between Electrodes is Prevented>

<Surface Contacting Adhesive Layer of Copper Foil>

<Surface of Adhesive Layer of Region, from which Copper Foil is Removed, after Forming Copper Foil>

<Surface of Transparent Photosensitive Resin Composition Layer>

FIG. 8A  <Structure of Electrode Substrate for Transparent Light Emitting Device Display>
FIG. 8B  <SEM Image>
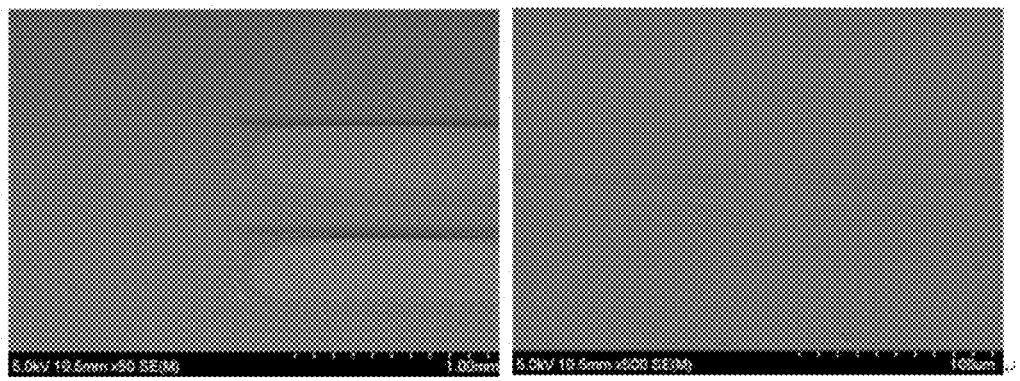
FIG. 8C  <Transmittance Picture>
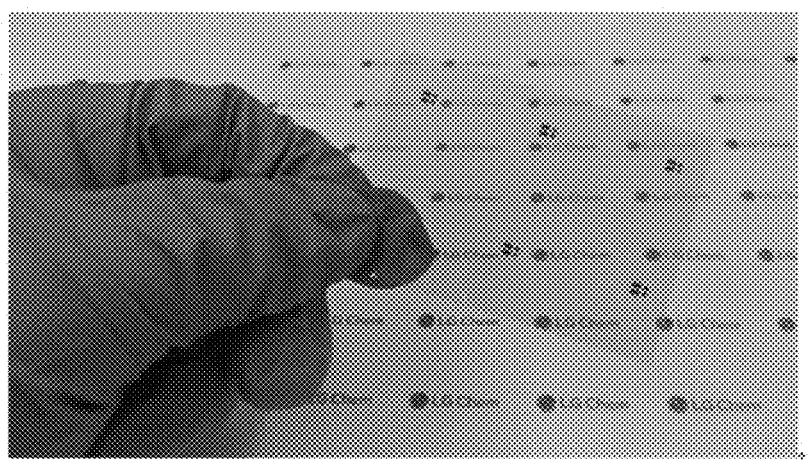

FIG. 9A  <Structure of Electrode Substrate for Transparent Light Emitting Device Display>
FIG. 9B  <SEM Image>
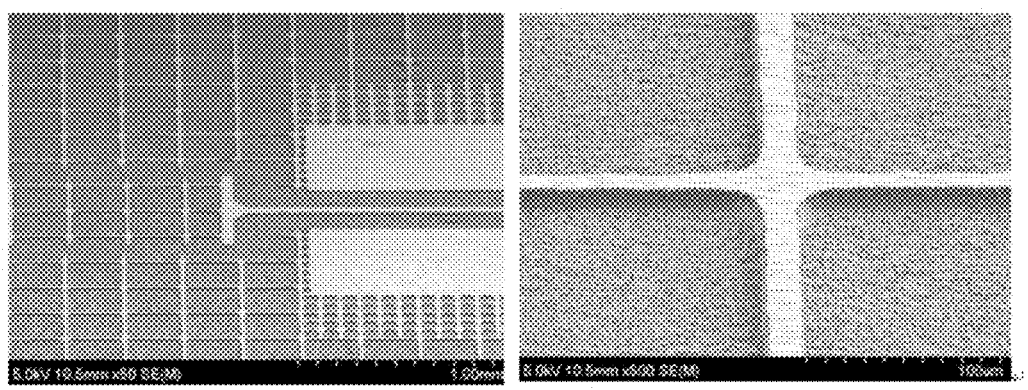
FIG. 9C  <Transmittance Picture>
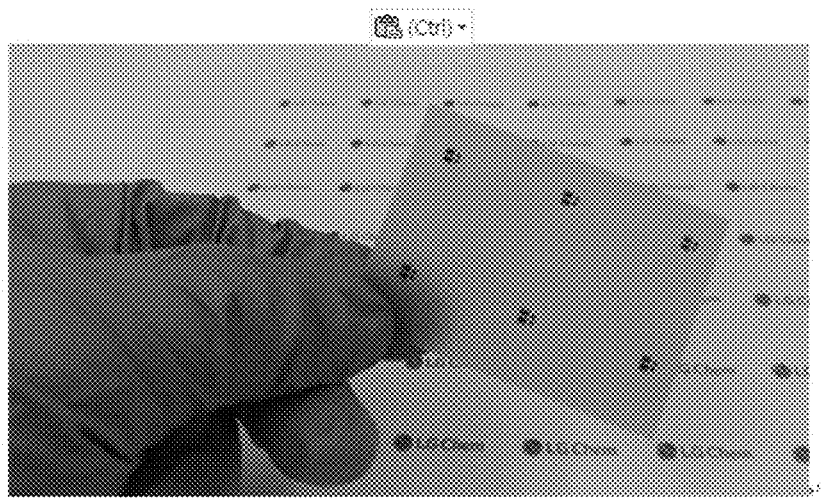

ELECTRODE SUBSTRATE FOR TRANSPARENT LIGHT-EMITTING DEVICE DISPLAY, AND MANUFACTURING METHOD THEREFOR

CROSS-REFERENCE TO RELATED APPLICATIONS

This application is a National Stage Application of International Application No. PCT/KR2018/010830 filed on Sep. 14, 2018, which claims priority to and the benefit of Korean Patent Application No. 10-2017-0120348 filed in the Korean Intellectual Property Office on Sep. 19, 2017, the entire contents of which are incorporated herein by reference.

TECHNICAL FIELD

The present application relates to an electrode substrate for a transparent light emitting device display and a method of manufacturing the same.

BACKGROUND

Recently, Korea creates various exterior lighting in parks and town centers, as well as colorful signs, and provides information and attraction to urban residents through the convergence of high-tech information and communication technology (ICT) and light emitting diode (LED) technology. Particularly, in a transparent LED display using an indium tin oxide (ITO) transparent electrode material, an LED is applied between glasses or a transparent film, to which an LED is applied, is attached to one surface of glass, and has an advantage in that wires are not viewed, so that it is possible to display light of high quality. Accordingly, the transparent LED display is utilized in the interior of a hotel, a department store and the like, and has increasing importance in implementing media façade of an exterior wall of a building.

According to a spread of a smart device, demands of a transparent electrode, which is transparent, is electrically conducted, and is used in a touch screen and the like, are explosive, and the most widely used transparent electrode among the transparent electrodes is an indium tin oxide (ITO) that is an oxide of indium and tin. However, reserves of indium, which is a main raw material of the material of the ITO transparent electrode, are not largely available globally and indium is produced in some countries, such as China, and production cost of indium is high. Further, indium has a disadvantage in that a resistance value is not constantly applied, so that an expressed light beam of an LED is not uniform. Accordingly, the transparent LED utilizing ITO has a limit in being utilized as a transparent electrode material with high performance and low cost.

It is a fact that the ITO has been most dominantly used as a transparent electrode material, but research and technology development utilizing a new material are continuously conducted due to a limit in economic feasibility, restricted performance, and the like. As a transparent electrode material attracting attention as a next-generation new material, there are metal mesh, an Ag nanowire, carbon nano tube (CNT), conductive polymer, graphene, and the like. Among them, the metal mesh is a new material, which occupies 85% of a material replacing the ITO, is low cost and has high conductivity, so that a market of the metal mesh is expanded in an aspect of utilization of the metal mesh.

The transparent LED display utilizing the metal mesh is easily repaired and maintained, is capable of saving resources, is capable of considerably preventing environmental contamination, and is economical by a decrease in manufacturing cost, compared to an existing ITO transparent display. Further, the transparent LED display utilizing the metal mesh can be expansively applied for various purposes and can be applied to and utilized in various products as a new transparent electrode material.

DISCLOSURE

Technical Problem

The present application is aimed at providing an electrode substrate for a transparent light emitting device display and a method of manufacturing the same.

Technical Solution

An exemplary embodiment of the present application provides a method of manufacturing an electrode substrate for a transparent light emitting device display, comprising: laminating copper foil on a transparent base material; forming a copper foil pattern by etching the copper foil; forming a transparent photosensitive resin composition layer on a front surface of the transparent base material and the copper foil pattern; and exposing at least a part of the copper foil pattern by removing at least a part of the transparent photosensitive resin composition layer provided on the copper foil pattern.

Another exemplary embodiment of the present application provides an electrode substrate for a transparent light emitting device display, comprising: a transparent base material; an adhesive layer provided on the transparent base material; a copper foil pattern provided on the adhesive layer; and a transparent photosensitive resin composition layer provided on the adhesive layer and the copper foil pattern, in which the transparent photosensitive resin composition layer is not provided in at least a partial region of the copper foil pattern, and haze of a region, in which the copper foil pattern is not provided, in the electrode substrate for the transparent light emitting device display is 5% or less.

Still another exemplary embodiment of the present application provides a transparent light emitting device display comprising the electrode substrate for the transparent light emitting device display.

Advantageous Effects

According to the exemplary embodiment of the present application, a metal pattern is formed by using low-price copper foil, so that it is possible to decrease raw material cost when an electrode substrate for a transparent light emitting device display is manufactured. Particularly, according to the exemplary embodiment of the present application, it is characterized that the transparent photosensitive resin composition layer is formed on the transparent base material and the copper foil pattern, so that it is possible to prevent an increase in haze of the electrode substrate for the transparent light emitting device display due to roughness of the surface of the copper foil, and a refractive index of the transparent photosensitive resin composition layer is adjusted, so that it is possible to decrease haze of the electrode substrate for the transparent light emitting device display.

Further, according to the exemplary embodiment of the present application, at least a part of the copper foil pattern is exposed by removing at least a part of the transparent photosensitive resin composition layer provided on the copper foil pattern, so that it is possible to form an electrode pad unit pattern, which is connected with an external terminal or in which a light emitting device is mounted.

DESCRIPTION OF DRAWINGS

FIGS. 1 and 2 are diagrams schematically illustrating an electrode substrate for a transparent light emitting device display according to an exemplary embodiment of the present application.

FIGS. 4A-4C are diagrams schematically illustrating a haze evaluation result according to an application of a transparent photosensitive resin composition layer.

FIGS. 5A and 5B are diagrams schematically illustrating the electrode substrate for the transparent light emitting device display according to an application of a transparent photosensitive resin composition layer.

FIG. 8A is a diagram illustrating a structure, FIG. 8B is a SEM image, and FIG. 8C is a transmittance picture of an electrode substrate for a transparent light emitting device display of Example 1.

FIG. 9A is a diagram illustrating a structure, FIG. 9B is a SEM image, and FIG. 9C is a transmittance picture of an electrode substrate for a transparent light emitting device display of Comparative Example 1.

EXPLANATION OF REFERENCE NUMERALS AND SYMBOLS

Figures 3A, 3B, 3C, 3D, 3E, 3F, 3G, 3H:
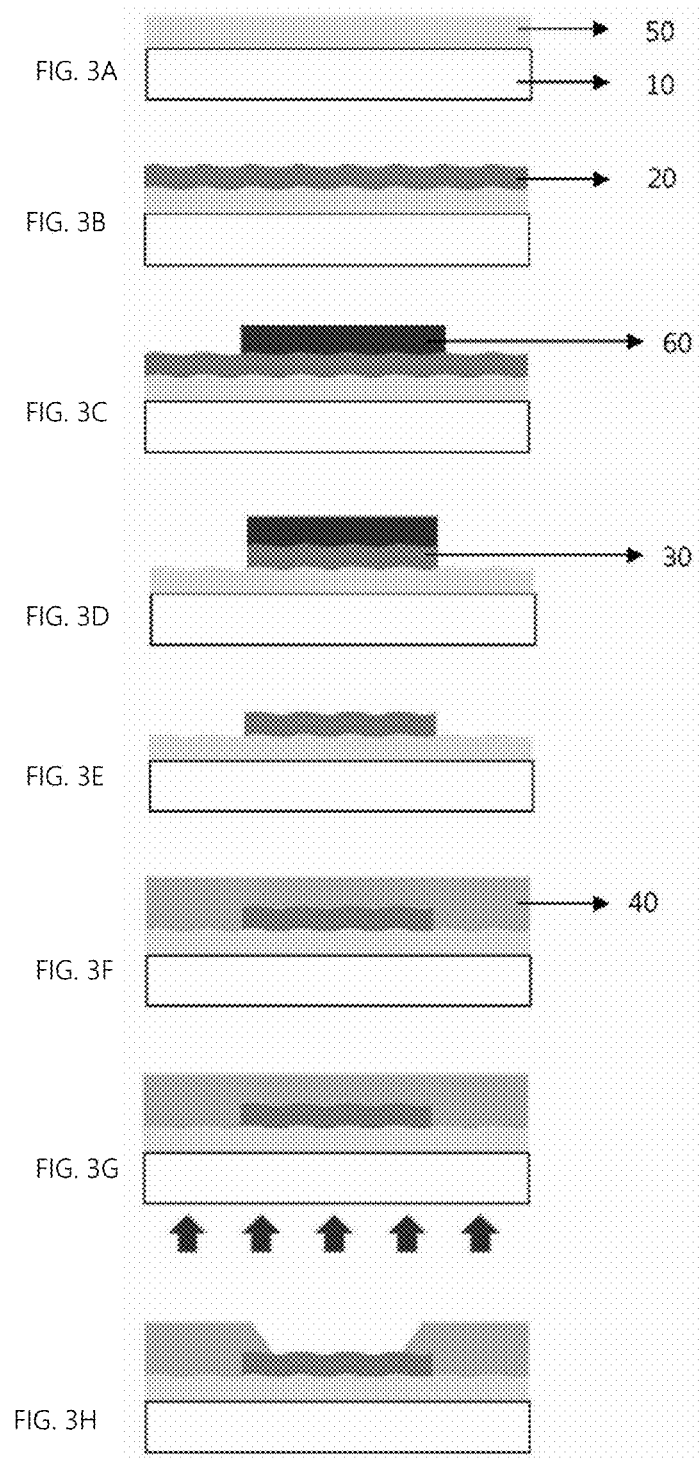
FIGS. 3A-3H are diagrams schematically illustrating a method of manufacturing an electrode substrate for a transparent light emitting device display according to an exemplary embodiment of the present application.

10: transparent base material
20: copper foil
30: copper foil pattern
40: transparent photosensitive resin layer
50: adhesive layer
60: resist pattern

BEST MODE FOR CARRYING OUT THE INVENTION

Hereinafter, the present application will be described in detail.

In the present application, "transparent" is defined to have a transmittance characteristic of about 80% or more in a visible ray region (400 nm to 700 nm).

In general, a transparent electrode substrate applied to a transparent light emitting diode (LED) display needs to secure a low resistance characteristic of 1 ohm/sq or less, and in order to secure low resistance and high transmittance, a metal layer, such as a Cu layer, of 2 μm or more is required. In the related art, a sputtering method is used for forming the metal layer, but when the sputtering method is used, there is a problem in that it is difficult to secure attachment force between a transparent base material and the metal layer, and a price of the transparent electrode substrate is sharply increased due to an increase in excessive deposition time.

In this respect, in order to secure price competitiveness, the present application is aimed at providing an electrode substrate for a transparent light emitting device display, which uses very low-cost copper foil as a metal layer, and a method of manufacturing the same.

A method of manufacturing an electrode substrate for a transparent light emitting device display according to an exemplary embodiment of the present application comprises: laminating copper foil on a transparent base material; forming a copper foil pattern by etching the copper foil; forming a transparent photosensitive resin composition layer on entire surfaces of upper portions of the transparent base material and the copper foil pattern; and exposing at least a part of the copper foil pattern by removing at least a part of the transparent photosensitive resin composition layer provided on the copper foil pattern.

The method of manufacturing the electrode substrate for the transparent light emitting device display according to the exemplary embodiment of the present application comprises laminating copper foil on a transparent base material.

The transparent base material can be a glass base material or a transparent plastic base material having excellent transparency, surface smoothness, treatment easiness, and waterproofing property, but is not limited thereto, and as long as a transparent base material is generally used in an electronic device, the transparent substrate is not limited. Particularly, the transparent base material can be a base material formed of glass, a urethane resin, a polyimide resin, a polyester resin, a (meth)acrylate-based polymer resin; a polyolefin-based resin, such as polyethylene or polypropylene, and the like.

A material known in the art can be used as the copper foil, and a thickness of the copper foil can be 2 μm to 15 μm, but is not limited thereto.

In the laminating of the copper foil on the transparent base material, an adhesive layer can be used. More particularly, the laminating of the copper foil on the transparent base material can comprise forming an adhesive layer on the transparent base material, and forming a copper foil on the adhesive layer.

The adhesive layer is positioned between the transparent base material and the copper foil and provides attachment force, and a refractive index of the adhesive layer can be 1.45 to 1.55. More particularly, as the adhesive layer, an acrylic resin, a silicon-based resin, an epoxy-based resin, a polyimide-based resin, and the like having a refractive index of 1.45 to 1.55 are used, and the adhesive layer can be formed in a thickness range of 5 μm to 30 μm by a method, such as comma coating and slot die coating, but the thickness of the adhesive layer is not limited thereto.

The method of manufacturing the electrode substrate for the transparent light emitting device display according to the exemplary embodiment of the present application comprises forming a copper foil pattern by etching the copper foil.

As a method of etching the copper foil, a method known in the art can be used. More particularly, the method of etching the copper foil can comprise forming a resist pattern on the copper foil and then etching the copper foil, and peeling the resist pattern, but is not limited thereto.

The copper foil pattern can comprise two or more kinds of copper foil pattern having different line widths. Further, the copper foil pattern can comprise two kinds of copper foil pattern having different line widths, and a line width of one kind of copper foil pattern is 3 μm to 30 μm, and a line width of the other kind of copper foil pattern is 50 μm or more. The copper foil pattern having the line width of 3 μm to 30 μm can serve as an electrode pattern, and the copper foil pattern having the line width of 50 μm or more can serve as an electrode pad unit pattern for a connection with an external terminal. That is, the copper foil pattern can comprise an electrode pattern and an electrode pad unit pattern. Further, a light emitting device can be mounted on the electrode pad unit pattern.

A line width of the electrode pattern can be 3 μm to 30 μm, can be 3 μm to 20 μm, and can be 3 μm to 0 μm, but is not limited thereto. Further, a line width of the electrode pad unit pattern can be 50 μm or more, and 50 μm to 100 μm, but is not limited thereto.

In the exemplary embodiment of the present application, the electrode pattern can comprise a metal mesh pattern. The metal mesh pattern configuring the electrode pattern can have the same line width and the same line height. In the exemplary embodiment of the present application, the same line width of the metal mesh pattern means that a standard deviation of a line width is 20% or less, preferably, 10% or less, and more preferably, 5% or less. Further, in the exemplary embodiment of the present application, the same line height of the metal mesh pattern means that a standard deviation of a line height is 10% or less, preferably, 5% or less, and more preferably, 2% or less.

Further, the metal mesh pattern can be provided in the entire region of an effective screen unit on the transparent base material, except for the electrode pad unit pattern. More particularly, the metal mesh pattern can be provided in a region having an area of 80% or more of the entire area of the upper surface of the transparent base material, and can be provided in a region having an area of 99.5% or less. Further, the metal mesh pattern can be provided in a region having an area of 80% or more of an area, in which a flexible printed circuit board (FPCB) pad unit region and an electrode pad unit pattern region provided on the transparent base material are excluded, based on the entire area of the upper surface of the transparent base material, and can be provided in a region having an area of 99.5% or less. In the present application, the FPCB pad unit region comprises an FPCB pad unit applying external power, and an area of the FPCB pad unit region can be equal to or larger than an entire area of an FPCB pad unit, and be equal to or smaller than three times of the entire area of the FPCB pad unit.

A pattern form in the art can be used as the metal mesh pattern. More particularly, the metal mesh pattern can comprise a polygonal pattern comprising one or more forms among a triangle, a quadrangle, a pentagon, a hexagon, and an octagon. The metal mesh pattern can comprise a straight line, a curve, or a closed curve formed of a straight line or a curve.

Further, the transparent photosensitive resin composition layer can be provided on the electrode pattern, and the transparent photosensitive resin composition layer may not be provided on at least a part of the electrode pad unit pattern.

The method of manufacturing the electrode substrate for the transparent light emitting device display according to the exemplary embodiment of the present application comprises forming a transparent photosensitive resin composition layer on entire surfaces of upper surfaces of the transparent base material and the copper foil pattern. The transparent photosensitive resin composition layer can be formed by applying a transparent photosensitive resin composition on entire surfaces of upper surfaces of the transparent base material and the copper foil pattern.

When the adhesive layer is provided on the transparent base material and then the low-price copper foil is laminated, surface roughness of the copper foil is transferred to a surface of the adhesive layer, so that there can be a problem in that haze of a final product is increased. In order to decrease surface roughness of the adhesive layer, a method of additionally applying a transparent resin having a similar refractive index to that of the adhesive layer onto the adhesive layer can be considered, but in this case, there can be a problem in that the electrode pad unit pattern for the connection with the external terminal or for the mounting of the light emitting device is insulated by a transparent resin layer. Accordingly, in the present application, the transparent photosensitive resin composition layer having photosensitivity is formed on the entire surfaces of the upper portions of the transparent base material and the copper foil pattern, so that it is possible to decrease surface roughness of the adhesive layer, and there is a characteristic in that the electrode pad unit pattern for the connection with the external terminal or for the mounting of the light emitting device can be exposed by removing at least a part of the transparent photosensitive resin composition layer by rear surface exposing and developing methods, which will be described below.

The transparent photosensitive resin composition is a negative-type transparent photosensitive resin composition, and a difference in a refractive index between the transparent photosensitive resin composition and the adhesive layer provided on the transparent base material can be within 0.05, and preferably, within 0.02. More particularly, as the transparent photosensitive resin composition, an acryl-based UV hardening resin having a refractive index of 1.45 to 1.52 can be used.

A thickness of the transparent photosensitive resin composition layer can be different according to a thickness of the copper foil pattern provided on the adhesive layer. More particularly, a thickness of the transparent photosensitive resin composition layer can have a difference of within 10 μm with a thickness of the copper foil pattern in consideration of easiness of a post-process, such as the LED mounting and the FPCB bonding. For example, when a thickness of the copper foil pattern is 5 μm or less, a thickness of the transparent photosensitive resin composition layer can be 15 μm or less. When a difference in a thickness between the copper foil pattern and the transparent photosensitive resin composition layer is larger than 10 μm, a possibility in that the LED is damaged is high when clearance is generated during the process of mounting the LED, and pressure is not transmitted to a conductive ball when a step is excessively generated during the FPCB bonding, so that there can be a problem in that it is impossible to carry an electric current.

A haze evaluation result according to an application of the transparent photosensitive resin composition layer is schematically illustrated in FIGS. 4A and 4B. When the transparent photosensitive resin composition layer is not applied as illustrated in FIG. 4A, it can be seen in FIG. 4C that roughness of the surface of the copper foil is transferred to the adhesive layer, so that haze is increased, and when the transparent photosensitive resin composition layer is applied like the present application shown in FIG. 4B, it can be seen in FIG. 4C that haze is decreased through the matching of the refractive indexes of the transparent photosensitive resin composition layer and the adhesive layer.

The method of manufacturing the electrode substrate for the transparent light emitting device display according to the exemplary embodiment of the present application comprises exposing at least a part of the copper foil pattern by removing at least a part of the transparent photosensitive resin composition layer provided on the copper foil pattern.

The removing at least a part of the transparent photosensitive resin composition layer provided on the copper foil pattern can comprise performing rear-surface exposing and developing on a lower surface of the transparent base material.

When the rear-surface exposing is performed on the lower surface of the transparent base material, the copper foil pattern provided on the adhesive layer serves as a photomask, so that a separate photomask is not necessary, and it is possible to fundamentally remove the generation of a fault due to an alignment error.

In the rear-surface exposing, parallel light exposing or scattered light exposing can be performed. When the parallel light exposing is performed during the rear-surface exposing, all of the electrode patterns and the electrode pad unit pattern can be exposed, which is schematically illustrated in FIG. 1. Further, when the scattered light exposing is performed during the rear-surface exposing, the electrode pad unit pattern can be exposed, which is schematically illustrated in FIG. 2.

Further, the method of manufacturing the electrode substrate for the transparent light emitting device display according to the exemplary embodiment of the present application is schematically illustrated in FIG. 3 FIGS. 3A to 3H.

Further, an exemplary embodiment of the present application provides an electrode substrate for a transparent light emitting device display, comprising: a transparent base material; an adhesive layer provided on the transparent base material; a copper foil pattern provided on the adhesive layer; and a transparent photosensitive resin composition layer provided on the adhesive layer and the copper foil pattern, in which the transparent photosensitive resin composition layer is not provided in at least a partial region on the copper foil pattern and haze of a region, in which the copper foil pattern is not provided, of the electrode substrate for the transparent light emitting device display is 5% or less. Haze of the region, in which the copper foil pattern is not provided, of the electrode substrate for the transparent light emitting device display can be 2% or less, and can be 1% or less.

In the electrode substrate for the transparent light emitting device display according to the exemplary embodiment of the present application, contents of the transparent base material, the adhesive layer, the copper foil pattern, the transparent photosensitive resin composition layer, and the like are the same as those described above, so that detailed descriptions thereof will be omitted.

The electrode substrate for the transparent light emitting device display according to an application of the transparent photosensitive resin composition layer is schematically illustrated in FIGS. 5A and 5B. As illustrated in FIGS. 5A and 5B, according to the exemplary embodiment of the present application, it is characterized that the transparent photosensitive resin composition layer is formed on the transparent base material and the copper foil pattern, so that it is possible to prevent an increase in haze of the electrode substrate for the transparent light emitting device display due to roughness of the surface of the copper foil, and a refractive index of the transparent photosensitive resin composition layer is adjusted, so that it is possible to decrease haze of the electrode substrate for the transparent light emitting device display.

The electrode substrate for the transparent light emitting device display according to the exemplary embodiment of the present application can be applied as a transparent electrode of a transparent light emitting device display.

Further, an exemplary embodiment of the present application provides a transparent light emitting device display comprising the electrode substrate for the transparent light emitting device display.

Figure 6A:
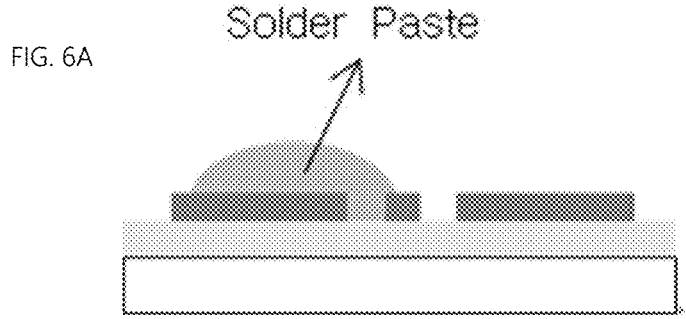
FIGS. 6A and 6B are diagrams schematically illustrating a short-circuit between electrodes during a solder paste process of the transparent light emitting device display.
Figure 6B:
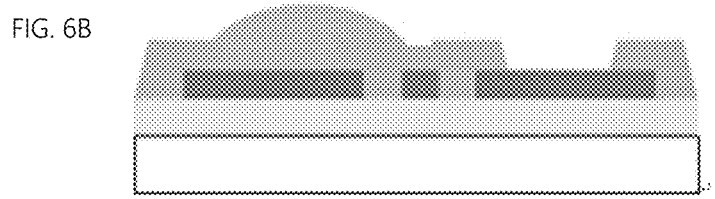

As illustrated in FIGS. 6A and 6B, in the transparent light emitting device display in the related art, a short-circuit can be generated between the electrodes during the solder-paste process for mounting the light emitting device on the electrode pad unit pattern. However, according to the exemplary embodiment of the present application, there is a characteristic in that it is possible to prevent a short-circuit between the electrodes by the transparent photosensitive resin composition layer during the solder-paste process for mounting the light emitting device on the electrode pad unit pattern.

MODE FOR CARRYING OUT THE INVENTION

Hereinafter, the exemplary embodiment described in the present specification will be exemplified through Examples. However, this does not intend to limit the range of the exemplary embodiments by Examples.

EXAMPLE

Example 1

A urethane acryl-based transparent adhesive was applied on a PET film having a thickness of 250 μm by using a comma coater, and then was dried with heat wind at 100° C. for five minutes to form an adhesive layer having a thickness of 10 μm. The PET film provided with the transparent adhesive layer and the copper foil having a thickness of 3 μm were hot-roll laminated under a condition of 120° C. and 1.4 (meter per minute (mpm)).

A dry film resist (DFR) was laminated on the copper foil surface of the copper foil laminated film and then a DFR pattern in a Voronoi form having a line width of 20 μm was formed by exposing and developing processes.

The exposed copper foil was removed by using a ferric chloride-based copper etchant and the DFR pattern was peeled to form a copper foil pattern in the Voronoi form. In this case, haze of a region, in which the copper foil pattern is not provided, was 40%.

A negative transparent photosensitive resin composition was applied on a base material, on which the copper foil pattern was provided, by using the comma coater and was dried at 120° C. for five minutes to form a negative transparent photosensitive resin composition layer having a thickness of 5 μm.

The transparent photosensitive resin composition was prepared by dissolving an acrylate resin of 16 g, of which weight average molecular weight is 10,100 g/mol, an acid value is 77 mgKOH/g, a ratio of an acrylic reactor is 30 mol %, dipentaerythritol hexaacrylate of 7.5 g, OXE-02 of 1 g of BASF Company as a photo initiator, and Glide-410 of 0.5 g that is a surfactant in Propylene Glycol Monomethyl Ether Acetate (PGMEA) of 75 g and then filtering the dissolved material was filtered by using a filter having a size of 0.1 μm.

A rear surface of a surface provided with the transparent photosensitive resin composition layer was radiated with the light amount of 100 mJ/cm² by using a parallel light exposure device (Karl Suss MA-8) and then was developed to selectively remove the photosensitive transparent resin composition layer applied on the copper foil pattern. In this case, haze of a region, in which the copper foil pattern is not provided, was 0.8%.

Figure 7A:
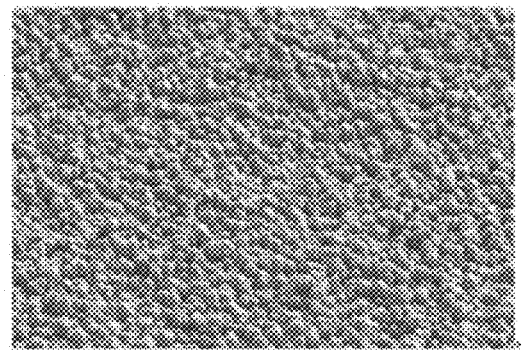
FIG. 7A is a diagram illustrating a surface, which is in contact with an adhesive layer of copper foil.
Figure 7B:
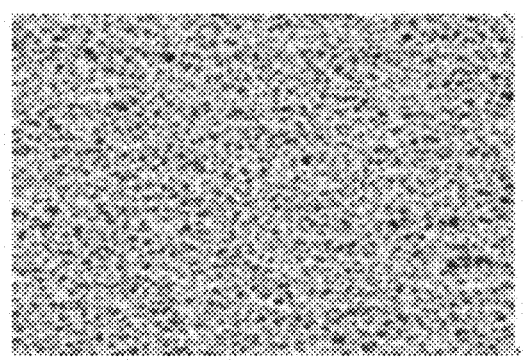
FIG. 7B is a diagram illustrating a surface of the adhesive layer, from which the copper foil is removed after the forming of a copper foil pattern.
Figure 7C:
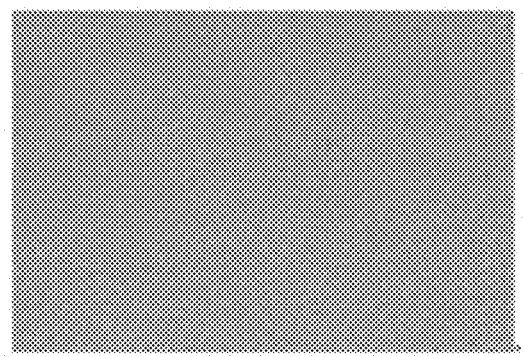
FIG. 7C is a diagram illustrating a surface of a transparent photosensitive resin composition layer of Example 1.

A surface, which is in contact with an adhesive layer of the copper foil, a surface of the adhesive layer, from which the copper foil is removed after the forming of the copper foil pattern, and a surface of the transparent photosensitive resin composition layer of Example 1 are illustrated in FIGS. 7A to 7C. As illustrated in FIG. 7A, the surface, which is in contact with the adhesive layer of the copper foil, is formed with nodules in order to maximize adhesive force with the adhesive layer. Further, as shown in FIG. 7B, the nodules are reflected to the surface of the adhesive layer, from which the copper foil is removed after the forming of the copper foil pattern, so that surface roughness of the adhesive layer is increased. Further, it can be seen in FIG. 7C that after the transparent photosensitive resin composition layer is formed, surface roughness is decreased by the transparent photosensitive resin composition layer.

Further, a structure, a SEM image, and a transmittance picture of the electrode substrate for the transparent light emitting device display of Example 1 are illustrated in FIGS. 8A 8B and 8C, respectively.

Comparative Example 1

Except that a transparent photosensitive resin composition layer is not formed as in Example 1, the method was identically performed to that of Example 1. In this case, haze of a region, in which the copper foil pattern is not provided, was 88.4%.

Further, a structure, a SEM image, and a transmittance picture of the electrode substrate for the transparent light emitting device display of Comparative Example 1 are illustrated in FIGS. 9A, 9B, and 9C, respectively.

As can be seen in the result, according to the exemplary embodiment of the present application, a metal pattern is formed by using low-price copper foil, so that it is possible to decrease raw material cost when an electrode substrate for a transparent light emitting device display is manufactured. Particularly, according to the exemplary embodiment of the present application, it is characterized that the transparent photosensitive resin composition layer is formed on the transparent base material and the copper foil pattern, so that it is possible to prevent an increase in haze of the electrode substrate for the transparent light emitting device display due to roughness of the surface of the copper foil, and a refractive index of the transparent photosensitive resin composition layer is adjusted, so that it is possible to decrease haze of the electrode substrate for the transparent light emitting device display.

Further, according to the exemplary embodiment of the present application, at least a part of the copper foil pattern is exposed by removing at least a part of the transparent photosensitive resin composition layer provided on the copper foil pattern, so that it is possible to form an electrode pad unit pattern, which is connected with an external terminal or in which a light emitting device is mounted.

The invention claimed is:

1. A method of manufacturing an electrode substrate for a transparent light emitting device display, the method comprising:

forming an adhesive layer on a transparent base material, the adhesive layer having a refractive index of 1.45 to 1.55 and a thickness in a range of 5 μm to 30 μm;
laminating a copper foil on the adhesive layer;
forming a copper foil pattern by etching the copper foil;
forming a transparent photosensitive resin composition layer on entire surfaces of upper portions of the transparent base material and the copper foil pattern; and
exposing at least a part of the copper foil pattern by removing at least a part of the transparent photosensitive resin composition layer provided on the copper foil pattern.

2. The method of claim 1, wherein a thickness of the copper foil is 2 μm to 15 μm.

3. The method of claim 1, wherein a refractive index of the transparent photosensitive resin composition layer is 1.45 to 1.55.

4. The method of claim 1, wherein a difference in a refractive index between the adhesive layer and the transparent photosensitive resin composition layer is within 0.05.

5. The method of claim 1, wherein a difference in a thickness between the transparent photosensitive resin composition layer and the copper foil pattern is within 10 μm.

6. The method of claim 1, wherein the removing of at least the part of the transparent photosensitive resin composition layer provided on the copper foil pattern comprises performing rear-surface exposing and developing on a lower surface of the transparent base material.

7. The method of claim 1, wherein the copper foil pattern comprises two or more kinds of copper foil pattern having different line widths.

8. The method of claim 7, wherein the copper foil pattern comprises an electrode pattern and an electrode pad unit pattern,
a line width of the electrode pattern is 3 μm to 30 μm, and
a line width of the electrode pad unit pattern is 50 μm or more.

9. The method of claim 8, wherein the electrode pattern comprises a metal mesh pattern, and
the metal mesh pattern is provided on an entire region of an effective screen unit on the transparent base material, except for the electrode pad unit pattern.

10. The method of claim 8, wherein the transparent photosensitive resin composition layer is provided on the electrode pattern, and
the transparent photosensitive resin composition layer is not provided on at least a part of the electrode pad unit pattern.

11. An electrode substrate for a transparent light emitting device display, the electrode substrate comprising:
a transparent base material;
an adhesive layer provided on the transparent base material, the adhesive layer having a refractive index of 1.45 to 1.55 and a thickness in a range of 5 μm to 30 μm;
a copper foil pattern provided on the adhesive layer, wherein:
the copper foil pattern comprises an electrode pattern and an electrode pad unit pattern,
a line width of the electrode pattern is 3 μm to 30 μm, and
a line width of the electrode pad unit pattern is 50 μm or more; and
a transparent photosensitive resin composition layer provided on the adhesive layer and the copper foil pattern, wherein:

the transparent photosensitive resin composition layer is not provided in at least a partial region of the copper foil pattern, the transparent photosensitive resin composition layer is provided on the electrode pattern, and the transparent photosensitive resin composition layer is not provided on at least a part of the electrode pad unit pattern; and a haze of a region, in which the copper foil pattern is not provided, in the electrode substrate for the transparent light emitting device display is 5% or less.

12. The electrode substrate of claim 11, wherein a difference in a refractive index between the adhesive layer and the transparent photosensitive resin composition layer is within 0.05.

13. The electrode substrate of claim 11, wherein a difference in a thickness between the transparent photosensitive resin composition layer and the copper foil pattern is within 10 μm.

14. The electrode substrate of claim 11, wherein haze of the region, in which the copper foil pattern is not provided, in the electrode substrate for the transparent light emitting device display is 2% or less.

15. The electrode substrate of claim 11, wherein the electrode pattern comprises a metal mesh pattern, and the metal mesh pattern is provided on an entire region of an effective screen unit on the transparent base material, except for the electrode pad unit pattern.

16. A transparent light emitting device display comprising the electrode substrate for the transparent light emitting device display of claim 11.

17. The method of claim 1, wherein the adhesive layer comprises an acrylic resin, a silicon-based resin, an epoxy-based resin, or a polyimide-based resin.

* * * * *